United States Patent
Nagahara (10) Patent No.: US 6,892,577 B2
(45) Date of Patent: May 17, 2005

(54) ACCELERATION SENSOR FORMED ON SURFACE OF SEMICONDUCTOR SUBSTRATE

(75) Inventor: Teruaki Nagahara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/654,002

(22) Filed: Sep. 4, 2003

(65) Prior Publication Data

US 2004/0163472 A1 Aug. 26, 2004

(30) Foreign Application Priority Data

Feb. 26, 2003 (JP) ........................... 2003-048444

(51) Int. Cl.⁷ ............................. G01P 1/02; G01P 15/125
(52) U.S. Cl. ................................. 73/514.32; 73/493
(58) Field of Search ........................... 73/493, 514.32, 73/514.01, 514.16, 514.36, 514.38; 361/280; 257/417

(56) References Cited

U.S. PATENT DOCUMENTS

| | | | |
|---|---|---|---|
| 5,223,086 A | * | 6/1993 | Terada et al. ............ 73/514.34 |
| 5,487,305 A | * | 1/1996 | Ristic et al. ............. 73/514.32 |
| 5,864,062 A | * | 1/1999 | Nagahara et al. ........ 73/514.32 |
| 6,323,529 B1 | | 11/2001 | Nagahara |
| 6,323,550 B1 | * | 11/2001 | Martin et al. ............... 257/417 |
| 6,435,028 B1 | | 8/2002 | Nagahara |

FOREIGN PATENT DOCUMENTS

| | | |
|---|---|---|
| JP | 8-114622 | 5/1996 |
| JP | 10-2911 | 1/1998 |
| JP | 2001-185737 | 7/2001 |
| JP | 2001-337105 | 12/2001 |

* cited by examiner

*Primary Examiner*—John E. Chapman
(74) *Attorney, Agent, or Firm*—Oblon, Spivak, McClelland, Maier & Neustadt, P.C.

(57) ABSTRACT

In a movable space, a boundary (CN1) between a ceiling surface and a wall surface of a cap (CA) has a curved plane. When stress is exerted on the cap (CA), this stress is dispersed accordingly around the boundary (CN1) having a high probability of generation of a crack. Therefore, generation of a crack in the cap (CN) is unlikely.

5 Claims, 6 Drawing Sheets

ACCELERATION SENSOR FORMED ON SURFACE OF SEMICONDUCTOR SUBSTRATE

BACKGROUND OF THE INVENTION

1. Field of the Invention

The present invention relates to an acceleration sensor, and is applicable to an automobile air bag system or other consumer devices.

2. Description of the Background Art

Today, many automobiles employ an air bag system, into which an acceleration sensor for detecting an impact is generally incorporated.

Efforts have been made on the acceleration sensor to be smaller and less costly so that the acceleration sensor may be incorporated into various automobiles. For example, as a material for a package covering a semiconductor chip which constitutes an acceleration detector and a signal processor of the acceleration sensor, metal has been replaced by resin.

A mass body, as a movable part for detecting acceleration, is provided on a substrate surface of a semiconductor chip including the acceleration detector. To provide movable space of the mass body, and to prevent dirt or water from entering into the movable space, a cap is bonded to the substrate surface of the semiconductor chip, thereby hermetically sealing the movable space. Such technique is disclosed in Japanese Patent Application Laid-Open No. 8-114622 (1996). Other documents related to the present application include Japanese Patent Application Laid-Open Nos. 10-2911 (1998); 2001-185737; and 2001-337105.

As described, in the acceleration sensor, a cap is provided on the surface of the substrate for the semiconductor chip. This cap is likely to receive stress exerted thereon from a resin package, which is caused by the change in ambient temperature during molding of the resin package, or when the acceleration sensor is being used.

When stress is exerted on the cap, while depending on the strength and frequency of the stress, a crack may occur in the cap. The crack thereby generated is likely to break hermetic sealing of the movable space of the mass body.

When hermetic sealing is broken, water, for example, may enter into the movable space, and eventually adhere to the mass body. As a result, a displacement characteristic of the mass body is varied, possibly exerting influence on detection of acceleration.

An effective way to avoid generation of a crack is to provide a sufficient thickness of the cap or of the substrate of the semiconductor chip, thereby enhancing their rigidity. However, this method results in an increased size of device which is not desirable.

SUMMARY OF THE INVENTION

The present invention has been made to solve the aforementioned problem, and an object is to provide an acceleration sensor having a structure for preventing a crack in the cap, even if the cap which is hermetically sealing the movable space of the mass body or the semiconductor chip is formed with a reduced thickness.

According to an aspect of the present invention, the acceleration sensor includes a semiconductor substrate, a cap and a stress absorbing section. The semiconductor substrate is provided with an acceleration detecting section which has a movable part for detecting an acceleration. The cap is provided on a surface of the semiconductor substrate and includes a ceiling and at least one wall for defining a movable space for the movable part and hermetically sealing the movable space. The stress absorbing section absorbs stress exerted on the cap exerted on the cap.

When stress is exerted on the cap, the stress absorbing section absorbs stress exerted on the cap, thus it may be possible to provide an acceleration sensor having a structure which greatly reduced the probability that the cap will crack, even if the cap or the semiconductor substrate are formed with a reduced thickness.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
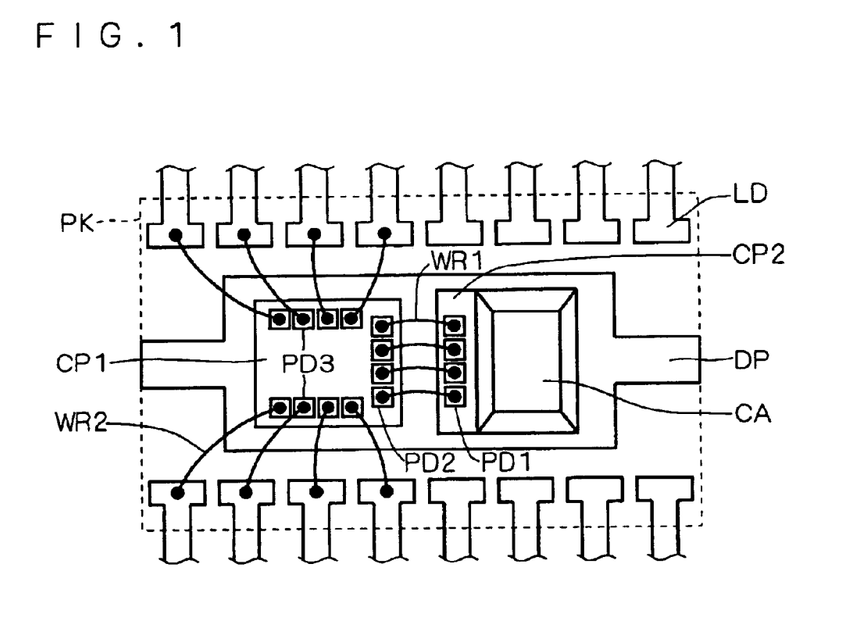
FIG. 1 is a top view illustrating an overall configuration of an acceleration sensor according to a first preferred embodiment of the present invention.

FIG. 1 is a top view of an overall configuration of an acceleration sensor according to the first preferred embodiment of the present invention. As shown in FIG. 1, the acceleration sensor includes a signal processing chip CP1, an acceleration detecting chip CP2 as an acceleration detector, leads LD, and a die pad DP.

Both the signal processing chip CP1 and the acceleration detecting chip CP2 are mounted on the die pad DP. Pads PD1 of the acceleration detecting chip CP2 and pads PD2 of the signal processing chip CP1 are connected through wires WR1. Pads PD3 of the signal processing chip CP1 and the leads LD are connected through wires WR2. The configuration described so far is covered with a resin package PK.

The leads LD are partially exposed from the resin package PK to serve as external terminals. In FIG. 1, the resin package PK, represented by a hidden line (dashed line), is shown to be transparent to indicate the internal configuration.

Figure 2:
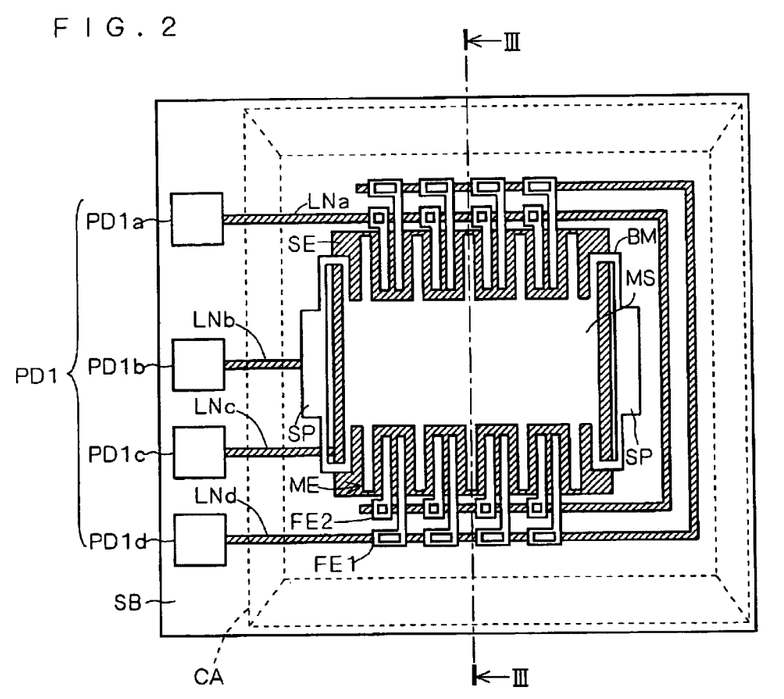
FIG. 2 is a top view of an acceleration detecting chip of the acceleration sensor according to the first preferred embodiment of the present invention.
Figure 3:
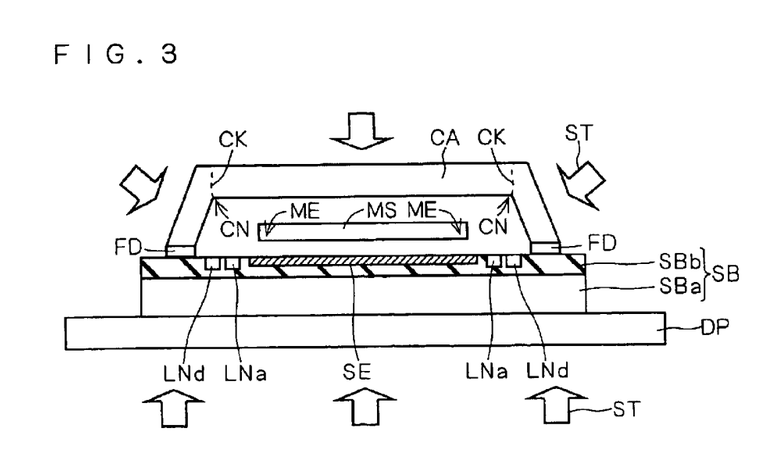
FIG. 3 is a sectional view of the acceleration detecting chip of the acceleration sensor according to the first preferred embodiment of the present invention.

FIGS. 2 and 3 are a top view and a sectional view, respectively, illustrating the acceleration detecting chip CP2. The sectional view of FIG. 3 is taken along a cutting line III—III in FIG. 2. As seen from FIGS. 1 through 3, a cap CA made of such as a single crystal silicon, corresponding to the cap described in the description of the background art, is bonded to a surface of a semiconductor substrate SB of the acceleration detecting chip CP2. In FIG. 2, the cap CA, represented by a hidden line (dashed line), is shown to be transparent to indicate the internal configuration.

In the acceleration detecting chip CP2, the semiconductor substrate SB includes a silicon substrate SBa, and a silicon oxide film SBb provided on an upper surface of the silicon substrate SBa. Pads PD1a through PD1d, collectively referred to as the pads PD1, are provided in a surface of the semiconductor substrate SB. Interconnect lines LNa through LNd, respectively connected to the pads PD1a through PD1d, are also placed in the surface of the semiconductor substrate SB. Further, a shield electrode SE connected to the interconnect line LNc is provided in the surface of the semiconductor substrate SB.

A mass body MS as a movable part for detecting acceleration, fixed electrodes FE1 connected to the interconnect line LNd, fixed electrodes FE2 connected to the interconnect line LNa, and support members SP of the mass body MS connected to the interconnect line LNb, are provided over the semiconductor substrate SB. The mass body MS is coupled to the support members SP through beams BM, and is held in midair.

The constituents in the surface of the semiconductor substrate SB, and those over the semiconductor substrate SB, are both formed using semiconductor manufacturing techniques. More particularly, photolithography, etching, impurity ion implantation, and the like, may be applied to obtain all the structures shown in FIG. 1 through FIG. 3. For example, silicon may be grown by epitaxy over the semiconductor substrate SB, followed by patterning using photolithography and etching. As a result, the silicon over the semiconductor substrate SB is shaped into the mass body MS, the fixed electrodes FE1 and FE2, the support members SP, the beams BM, and the like, as shown in FIG. 1 through FIG. 3.

Movable electrodes ME, as combed shape electrodes, are provided on both sides of the mass body MS. The fixed electrodes FE1 and FE2 are so placed that they each face the movable electrodes ME. When acceleration is applied, the beams BM deflect and the mass body MS deviates, thereby varying the distance between the movable electrode ME and the fixed electrode FE1, or between the movable electrode ME and the fixed electrode FE2. This variation in distance causes the electrostatic capacity to change between the movable electrode ME and the fixed electrode FE1, or between the movable electrode ME and the fixed electrode FE2. Detection of the change in electrostatic capacity between these electrodes serves to detect acceleration.

That is, the mass body MS serves as a movable part for detecting acceleration, and the fixed electrodes FE1 and FE2, and the movable electrodes ME of the mass body MS, work as an acceleration detecting part.

The cap CA is bonded to the surface of the semiconductor substrate SB in such a manner that the movable space of the mass body MS is defined, and the movable space is hermetically sealed. To be exact, the cap CA is bonded to the surface of the semiconductor substrate SB through a cap base FD, as shown in FIG. 3.

In the movable space shown in FIG. 3, cracks CK such as the one described in the description of the background art occur at boundaries CN between a ceiling surface of the cap CA opposite to the surface of the semiconductor substrate SB, and wall surfaces of the cap CA for connecting the ceiling surface and the surface of the semiconductor substrate SB. When stress ST is exerted from outside on the cap CA or the semiconductor substrate SB, the cracks CK are likely to occur at the boundaries CN as end portions of the wall surfaces for supporting the ceiling.

Figure 4:
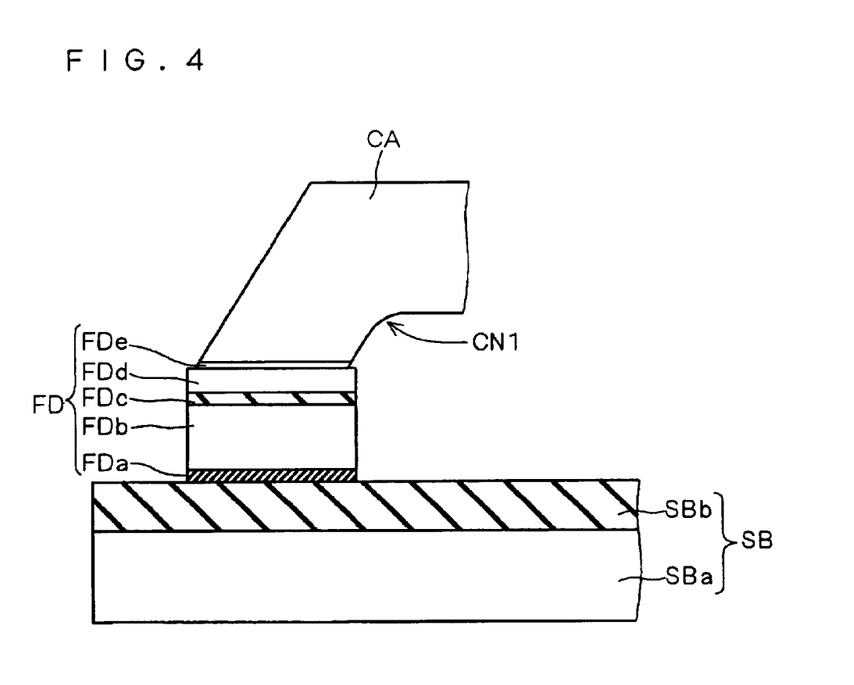
FIG. 4 is a sectional view illustrating a bonded part of a cap and its vicinity which constitute the acceleration detecting chip of the acceleration sensor according to the first preferred embodiment of the present invention.

In the movable space of the first preferred embodiment, a boundary CN1 between the ceiling surface and the wall surface of the cap CA has a curved plane as shown in FIG. 4. When stress is exerted on the cap CA, this stress is dispersed accordingly around the boundary CN1 having a curved plane. As a result, generation of a crack in the cap CA is less possible.

Accordingly, it may be possible to provide an acceleration sensor having a structure which reduces the probability of a crack in the cap CA, even if the cap CA or the semiconductor substrate SB are formed with reduced thickness.

FIG. 4 illustrates a detailed structure of the cap base FD, which may be formed with laminating films including, for example, a silicon nitride film FDa, a doped polysilicon film FDb, a silicon oxide film FDc, a non-doped polysilicon film FDd, and a metal film FDe such as a titanium film or a nickel film.

An exemplary method of forming the cap CA is as follows. First, anisotropic etching (which may be wet etching using KOH) is performed on a silicon substrate to expose a predetermined crystal face, whereby the ceiling and wall surfaces of the cap CA are formed in the movable space. At this stage, the boundaries between the ceiling surface and the wall surfaces have no curved plane.

Figure 5:
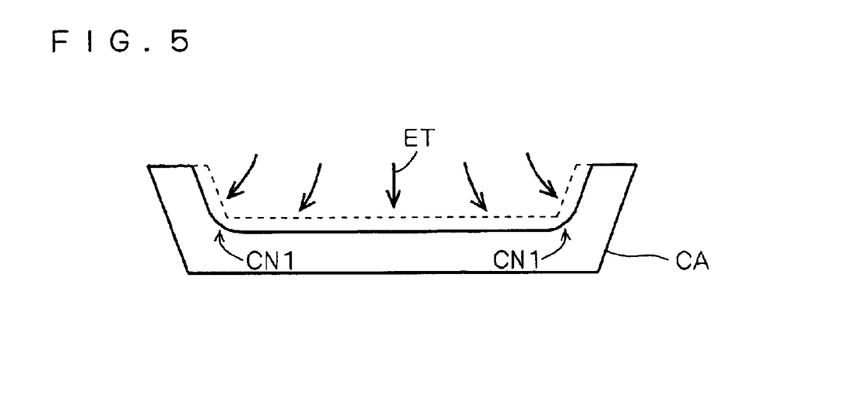
FIG. 5 illustrates a method of forming the cap which constitutes the acceleration detecting chip of the acceleration sensor according to the first preferred embodiment of the present invention.

Thereafter, as shown in FIG. 5, the ceiling and wall surfaces of the cap CA undergo isotropic etching ET (which may be wet etching using a mixture of nitric acid, acetic acid, and hydrofluoric acid). As a result, curved planes are defined at the boundaries CN1 between the ceiling surface and the wall surfaces of the cap CA.

Second Preferred Embodiment

Figure 6:
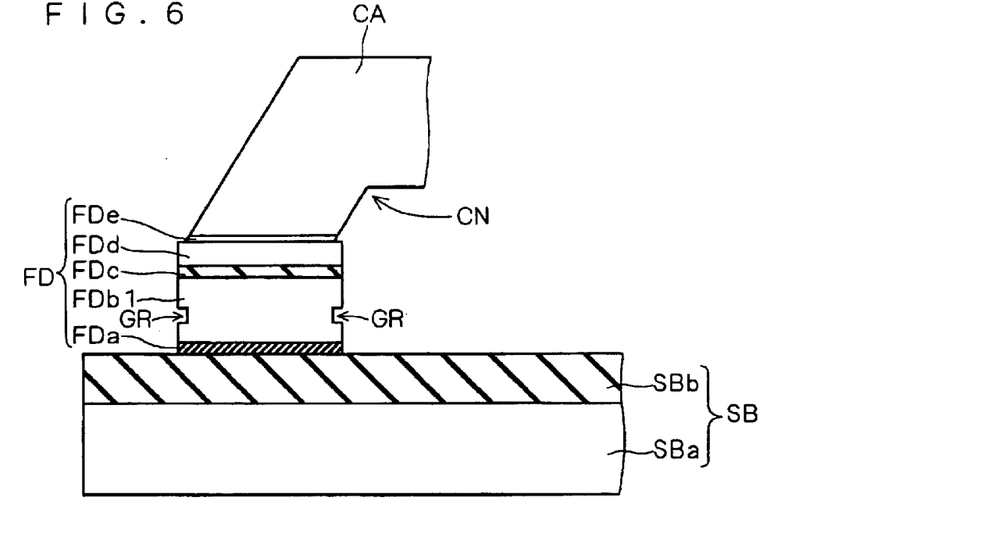
FIG. 6 is a sectional view illustrating a bonded part of a cap and its vicinity which constitute an acceleration detecting chip of an acceleration sensor according to a second preferred embodiment of the present invention.

FIG. 6 is a sectional view illustrating a bonded part of a cap and its vicinity which constitute an acceleration detecting chip of an acceleration sensor according to the second preferred embodiment of the present invention.

In the second preferred embodiment, grooves GR are provided on side surfaces of the cap base FD, which is held between the cap CA and the semiconductor substrate SB for bonding the cap CA and the semiconductor substrate SB together. More specifically, the grooves GR are provided on a doped polysilicon film FDb1, as a part of the laminating films of the cap base FD. As an example, the grooves GR may be provided in parallel with the surface of the semiconductor substrate SB.

As the structure of FIG. 6 is the same as the one given in FIG. 4, except that the doped polysilicon film FDb is replaced by the doped polysilicon film FDb1, and the boundary CN has no curved plane, description of the remaining structure is omitted. case, the aforementioned effect is achieved.

When the semiconductor substrate SB is distorted, the grooves GR provided on the side surfaces of the cap base FD absorb stress from the semiconductor substrate SB. As a result, generation of a crack in the cap CA is less possible. Accordingly, it may be possible to provide an acceleration sensor having a structure which reduces the probability of a crack in the cap CA, even if the cap CA or the semiconductor substrate SB are formed with a reduced thickness.

It is not necessary to provide the grooves GR on both side (in- and out-side) surfaces of the cap base FD. In other words, one groove GR may be provided on one side (in- or out-side) surface of the cap base FD, continuously or intermittently. In that case, the aforementioned effect is achieved.

FIGS. 7 through 10 are views illustrating a method of forming the grooves GR on the side surfaces of the cap base FD.

Figure 7:
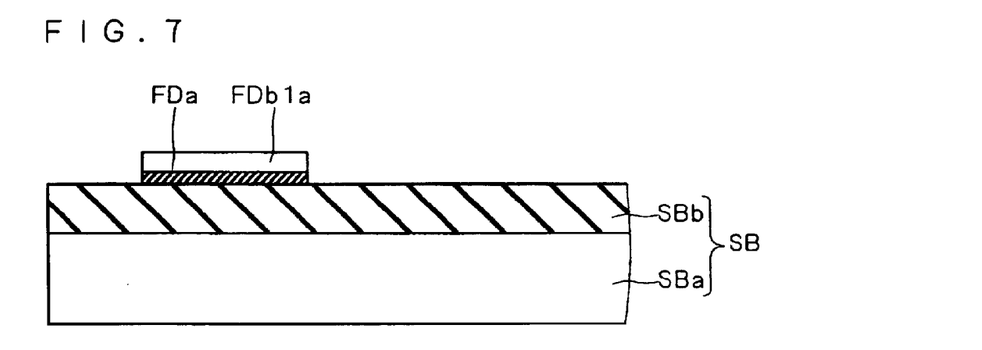
FIGS. 7 through 10 are sectional views illustrating a method of forming a cap foundation which constitutes the acceleration detecting chip of the acceleration sensor according to the second preferred embodiment of the present invention.

First, using a technique such as CVD (chemical vapor deposition), a silicon nitride film and a doped polysilicon film are deposited in this order on the silicon oxide film SBb as a part of the semiconductor substrate SB. These films thereafter undergo photolithography and etching, to be respectively patterned into the silicon nitride film FDa and a doped polysilicon film FDb1$a$ as shown in FIG. 7.

Figure 8:
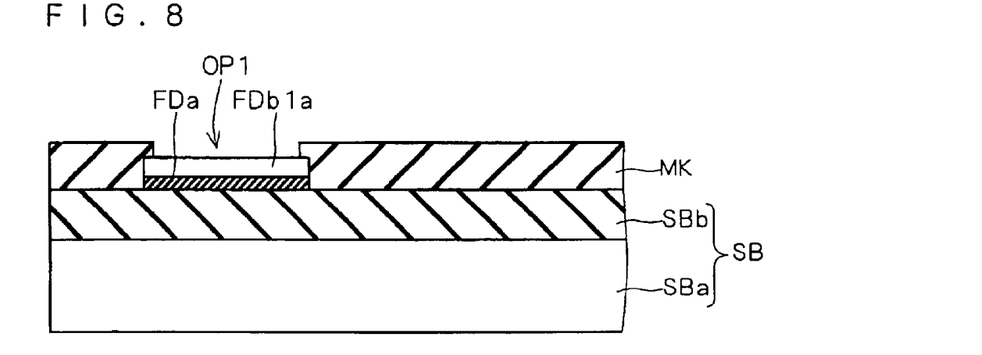

Next, a mask film MK, which may be a silicon oxide film, for example, is provided on the silicon oxide film SBb and the doped polysilicon film FDb1$a$ as shown in FIG. 8. The mask film MK is grown to a thickness corresponding to the sum of the thicknesses of the silicon nitride film FDa and the doped polysilicon film FDb1$a$, and the widths of the to-be-formed grooves GR. Using photolithography and etching, an opening OP1 is thereafter defined in the mask film MK. The opening OP1 is smaller in width than the silicon nitride film FDa and the doped polysilicon film FDb1$a$ by the depths of the grooves GR to be provided on both side surfaces of the base FD.

Figure 9:
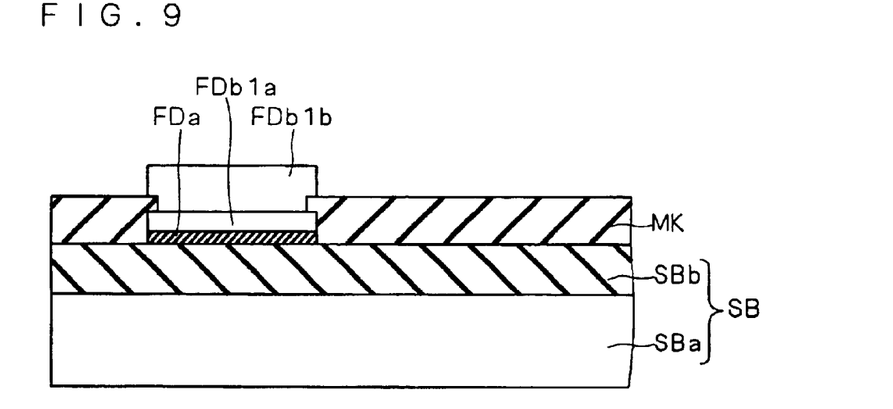

Subsequently, a doped polysilicon film is provided on the mask film MK and the doped polysilicon film FDb1$a$. The next step is patterning using photolithography and etching, with a pattern width which is the same as the one for defining the silicon nitride film FDa and the doped polysilicon film FDb1$a$, whereby a doped polysilicon film FDb1$b$ is formed as shown in FIG. 9.

Figure 10:
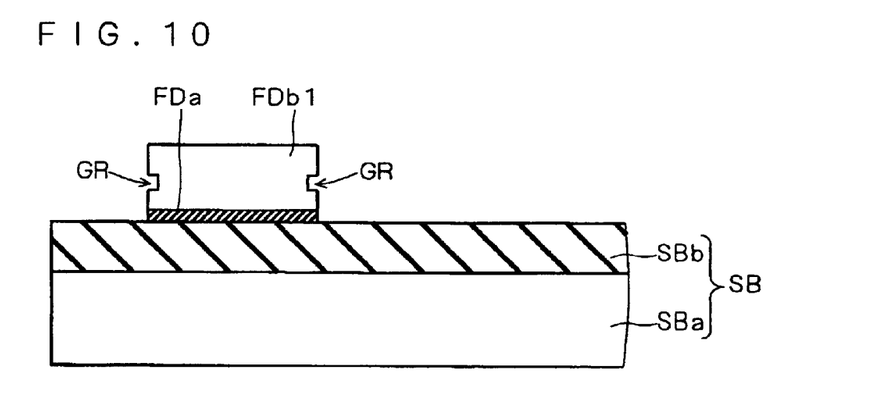

The next step is removal of the mask film MK to reach the structure of FIG. 10, where the doped polysilicon film FDb1 provided with the grooves GR is obtained.

Third Preferred Embodiment

Figure 11:
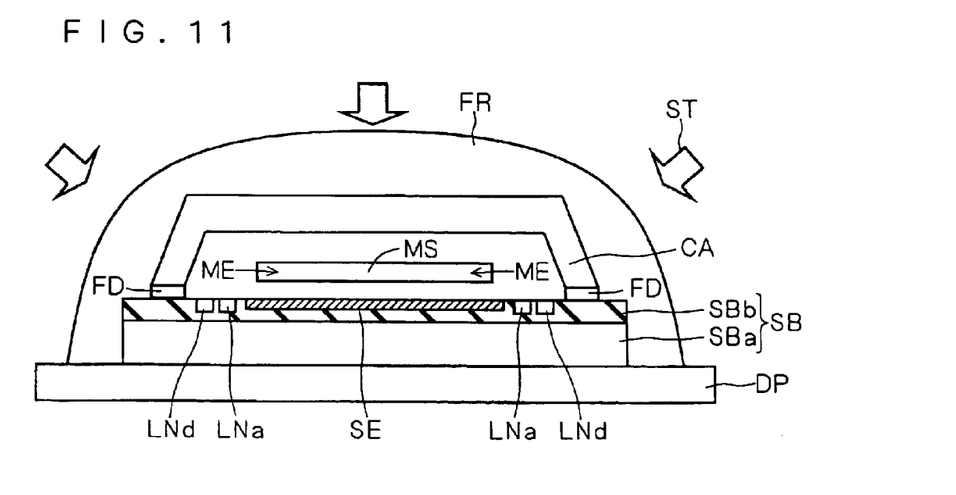
FIG. 11 is a sectional view illustrating an acceleration detecting chip and its vicinity of an acceleration sensor according to a third preferred embodiment of the present invention.

FIG. 11 is a sectional view illustrating an acceleration detecting chip and its vicinity of an acceleration sensor according to the third preferred embodiment of the present invention.

In the third preferred embodiment, the cap CA is covered with a foam resin cover FR lower in elastic modulus (namely, softer) than the cap CA. The foam resin cover FR may be silicone gel, for example. The stress ST, when exerted from outside or from the resin package PK shown in FIG. 1, can be absorbed accordingly by deformation of the foam resin cover FR, or by breakage of bubbles inside the foam resin cover FR. In the acceleration sensor according to the third preferred embodiment, the stress ST, exerted from the resin package PK, for example, is absorbed by the foam resin cover FR lower in elastic modulus than the cap CA. As a result, generation of a crack in the cap CA is less possible.

Accordingly, it may be possible to provide an acceleration sensor having a structure which reduces the probability of a crack in the cap CA, even if the cap CA or the semiconductor substrate SB are formed with a reduced thickness.

Fourth Preferred Embodiment

Figure 12:
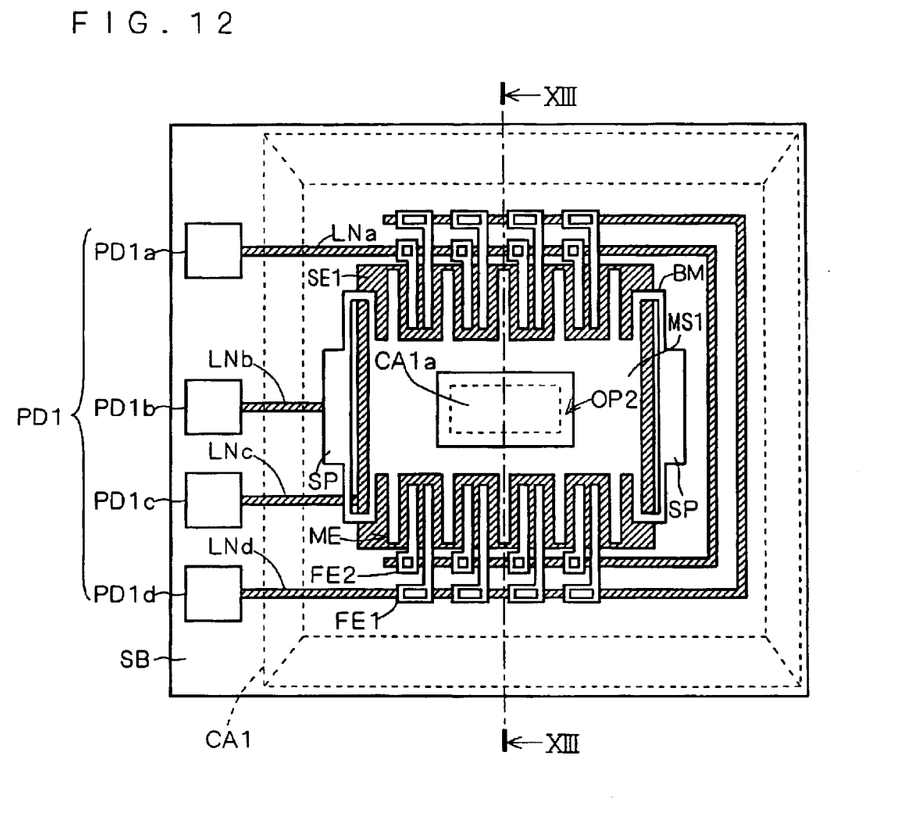
FIG. 12 is a top view of an acceleration detecting chip of an acceleration sensor according to a fourth preferred embodiment of the present invention.
Figure 13:
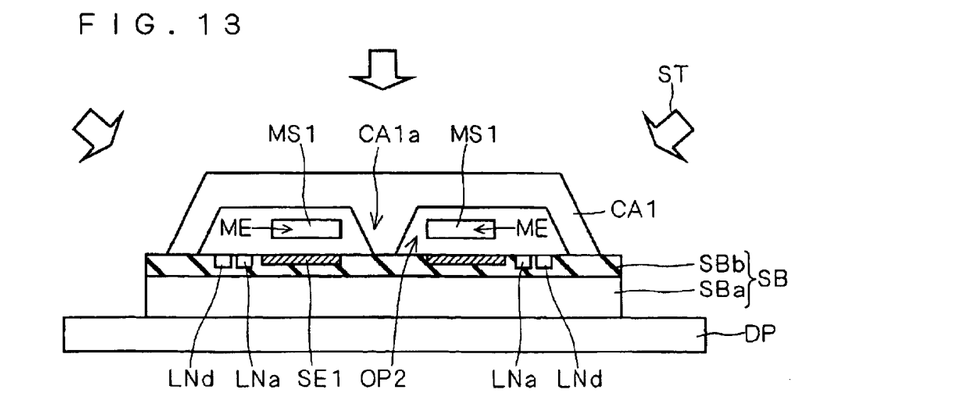
FIG. 13 is a sectional view of the acceleration detecting chip of the acceleration sensor according to the fourth preferred embodiment of the present invention.

FIGS. 12 and 13 are a top view and a sectional view, respectively, illustrating the acceleration detecting chip CP2, corresponding to the one shown in FIG. 1, of the fourth preferred embodiment of the present invention. The sectional view of FIG. 13 is taken along a cutting line X III—X III in FIG. 12. As seen from FIGS. 12 and 13, a cap CA1 is bonded to the surface of the substrate SB of the semiconductor chip. Similar to the cap CA of FIG. 2, the cap CA1 is represented by a hidden line (dashed line) and shown to be transparent in FIG. 12 to indicate the internal configuration.

In contrast to the cap CA of the first through third preferred embodiments, a ceiling surface of the cap CA1 is partially provided with a column CA1$a$ in the movable space which reaches the surface of the semiconductor substrate SB. In contrast to the mass body MS of the first through third preferred embodiments, a mass body MS1 includes a hole OP2 provided in the central portion thereof. Without touching the mass body MS1, the column CA1$a$ penetrates the hole OP2.

In contrast to the shield electrode SE of the first through third preferred embodiments, a shield electrode SE1 is not provided under the hole OP2, whereby the column CA1$a$ does not contact the shield electrode SE1.

The structure of the fourth preferred embodiment is the same as the one given in FIG. 11, except the foregoing differences, and except that there is no foam resin cover FR. Therefore, description of the remaining structure is omitted.

According to the acceleration sensor of the fourth preferred embodiment, in the movable space, the column CA1$a$ is provided between a part of the ceiling surface of the cap CA1 and the surface of the semiconductor substrate SB. As a result, when stress is exerted on the cap CA1, the column CA1$a$ absorbs the stress. Therefore, the ceiling surface of the cap CA1 is unlikely to be warped, whereby generation of a crack in the cap CA1 is less possible. Accordingly, it may be possible to provide an acceleration sensor having a structure which reduces the occurrences of a crack in the cap CA1, even if the cap CA1 or the semiconductor substrate SB cannot be formed with a sufficient thickness.

In the acceleration sensor of the fourth preferred embodiment, the column CA1$a$ of the cap CA1 penetrates the hole OP2 of the mass body MS1, without touching the mass body MS1. As a result, the column CA1$a$ may be defined at the position of the mass body MS1 in the movable space without impeding displacement of the mass body MS1 caused by acceleration. Accordingly, the column CA1$a$ can be provided without spreading the movable space, thereby rendering the acceleration sensor to be less in size.

Others

Each structure of the aforementioned respective preferred embodiments may be applied to an acceleration sensor, either alone or in combination.

While the invention has been shown and described in detail, the foregoing description is in all aspects illustrative and not restrictive. It is therefore understood that numerous modifications and variations can be devised without departing from the scope of the invention.

What is claimed is:

1. An acceleration sensor, comprising:

a semiconductor substrate provided with an acceleration detecting section, said acceleration detecting section having a movable part for detecting an acceleration;

a cap provided on a surface of said semiconductor substrate, said cap including a ceiling and at least one wall for defining a movable space for said movable part and hermetically sealing said movable space; and a stress absorbing section for absorbing stress exerted on said cap, wherein said stress absorbing section is formed by at least one curved boundary between the ceiling and the at least one wall, and said cap is coupled to said semiconductor substrate by a plurality of laminating films.

2. An acceleration sensor, comprising:

a semiconductor substrate provided with an acceleration detecting section, said acceleration detecting section having a movable part for detecting an acceleration;

a cap provided on a surface of said semiconductor substrate, said cap including a ceiling and at least one wall for defining a movable space for said movable part and hermetically sealing said movable space; and a stress absorbing section for absorbing stress exerted on said cap, wherein said cap includes a cap base held between at least one wall of said cap and said semiconductor substrate, and said stress absorbing section is formed by at least one groove provided on at least one side surface of said cap base.

3. An acceleration sensor, comprising:

a semiconductor substrate provided with an acceleration detecting section, said acceleration detecting section having a movable part for detecting an acceleration;

a cap provided on a surface of said semiconductor substrate, said cap including a ceiling and at least one wall for defining a movable space for said movable part and hermetically sealing said movable space; and a stress absorbing section for absorbing stress exerted on said cap, wherein said stress absorbing section is formed by a foam resin cover covering said semiconductor substrate and said cap, said foam resin cover being lower in elastic modulus than said cap.

4. An acceleration sensor, comprising:

a semiconductor substrate provided with an acceleration detecting section, said acceleration detecting section having a movable part for detecting an acceleration;

a cap provided on a surface of said semiconductor substrate, said cap including a ceiling and at least one wall for defining a movable space for said movable part and hermetically sealing said movable space; and a stress absorbing section for absorbing stress exerted on said cap, wherein said stress absorbing section is formed by a column between a part of the ceiling of said cap and the surface of said semiconductor substrate.

5. The acceleration sensor according to claim 4, wherein said movable part includes a hole through which said column penetrates without touching said movable part.

* * * * *